United States Patent [19]
Seelbach

[11] 4,184,147
[45] Jan. 15, 1980

[54] INPUT DEVICE FOR INPUT OF ALPHANUMERIC CHARACTERS INTO A COMPUTER

[76] Inventor: Hans E. Seelbach, Georgenstrasse 13, München, Fed. Rep. of Germany

[21] Appl. No.: 867,882

[22] Filed: Jan. 9, 1978

[30] Foreign Application Priority Data

Jan. 12, 1977 [DE] Fed. Rep. of Germany ....... 2701115

[51] Int. Cl.² .............................................. G06K 9/00
[52] U.S. Cl. ............................... 340/146.3 SY; 178/18
[58] Field of Search .................. 340/146.3 SY, 365 C, 340/365 S; 178/18

[56] References Cited

U.S. PATENT DOCUMENTS

| | | | |
|---|---|---|---|
| 3,704,343 | 11/1972 | Howard | 178/18 |
| 3,835,453 | 9/1974 | Narayanan | 340/146.3 SY |
| 3,996,557 | 12/1976 | Donahey | 340/146.3 SY |
| 4,005,400 | 1/1977 | Engdahl | 340/146.3 SY |
| 4,047,010 | 9/1977 | Perotto et al. | 340/146.3 SY |
| 4,070,649 | 1/1978 | Wright, Jr. et al. | 340/146.3 SY |

*Primary Examiner*—Leo H. Boudreau
*Attorney, Agent, or Firm*—Staas & Halsey

[57] ABSTRACT

A character input device has a panel on which a character can be written by the finger or a stylus, the panel area being subdivided into three or four sensors. Pressure on each sensor, and on the central area of the panel, causes printed contact areas to engage to provide a signal. Associated electronic circuitry takes account of the sequence of signal production, including repetition of signals, to identify each character. A plurality of such panels can be arranged side-by-side. Each character written in is displayed on associated display means which may be located beneath the panel where this is transparent. Appropriate function controls are provided on the device which may be portable and connected to an associated computer, for example, by a wireless transmission.

15 Claims, 7 Drawing Figures

INPUT DEVICE FOR INPUT OF ALPHANUMERIC CHARACTERS INTO A COMPUTER

BACKGROUND OF THE INVENTION

An input device for input of alphanumeric characters into a computer, is known from DT-AS 22 35 620. The device has a character input zone in the form of a panel having sensors together with additional function keys, as well as logic and memory means in which the signals from the sensors are stored and scanned in a predetermined sequence for recognition of the characters. The device is used for the manual input of letterpress, alphanumeric character sequences as well as command codes into electronic computers. This known input device is a stationary input apparatus connected integrally with the computer. The sensors in the input zone are so chosen in number and arrangement that each input character can be clearly recognized solely by the combination of the sensors touched at input. In order to ensure this freedom from ambiguity a relatively large number of sensors is necessary. The sequence in which the sensors are touched while writing is unimportant and is not recorded. In the recognition of the character, the stored signals from the sensors are scanned in a certain sequence, and the sequence in time of the writing of a character can no longer be recognized. Moreover, the input zone of the device is such that a stylus must be employed for the input of the characters.

An object of the invention is to provide a character input device requiring only three or four sensors. A further object of the invention is to provide a character input device which can be used by relatively unskilled persons.

Another object of the invention is to provide a character input device of compact and simple, and consequently inexpensive construction.

An additional object of the invention is to provide a character input device capable of responding correctly to characters written in a variety of styles.

Yet another object of the invention is to provide a character input device which is portable and free of wired connection to the apparatus to which character representing signals are supplied.

SUMMARY OF THE INVENTION

In accordance with the invention, a character input device has at least three and preferably four sensors provided in a character input panel, a specific signal being associated with simultaneous touching of at least two of the sensors, and the time sequence of the touching of the sensors, inclusive of repeated touchings of one sensor being stored and employed for recognition of the respective character.

In a device embodying the invention, the drawing process is recorded dynamically, so that with relatively few sensors a high redundancy is achieved. Whilst the difference for example between the letter B and the figure 8 in static recording, that is, recording merely the combination of certain sensors, can be recognized only with line directions and by a large number of sensors, in the dynamic drawing process, that is, the drawing process in which the sequence of the sensors touched is recorded too, there is sufficient redundancy so that even with line directions which are not exact a clear difference can be made out with a small number of sensors.

Three sensors of touch-sensitive areas in the panel are adequate for distinguishing, for example, the letter B from the figure 8. Touching or running across one of the sensors gives one signal during the contact, whilst simultaneous touching of two sensors is ignored by the associated electronic equipment (a micro-processor) and finally simultaneous touching of the three sensors in a central region of the panel is recognized as a fourth signal.

Advantageously, where four sensors are employed, at least two of the sensors have unlike surface shapes. Furthermore, with four sensors it is advantageous if a specific signal is associated with the simultaneous touching of all four sensors. Five signals are thus obtained in a certain sequence, whereby so much additional redundancy is provided that even with different ways of writing which customarily occur a one and the same character can be recognized, so that fewer instructions for the input of characters are required.

The input device is advantageously so constructed that the panel contains a first layer which is arranged on a rigid support and has printed sensors, and a further layer having a printed circuit with an insulating spacer interposed, which further layer deforms under pressure to afford an electrically conductive contact. A protective layer may be provided over this further layer. By this means a particularly compact and simple construction of the input device is obtained.

The protective layer may be provided with two crossed centrelines, preferably slightly elevated to form a graticule, which serves for better orientation of the characters to be drawn.

Advantageously a conductive area of the printed circuit on the overlying layer, which lies above all the sensors, is made as an area which buckles downwards under pressure. By means of this "snap-action" effect, a satisfactory contact with all four sensors is achieved when the finger or stylus runs across this conductive area.

The layers may be made of transparent material and the area lying underneath them be made as an output display zone. In this way the input device may be made still more compact.

So that the input device can be employed individually as an independent unit, it is advantageously made portable, with a plurality of display or indicator elements above the panel. Moreover, a unit for radio transmission of signals corresponding with the input characters and for reception of replies is incorporated in or connected to it. By this means, the range of use of the input device in accordance with the invention, particularly for control purposes, is considerably widened.

Instead of only one character input panel, a plurality of such panels may be provided in the input region of the device.

The signals emitted by the sensors are advantageously stored in the logic and memory unit until the finish of the input of a character, whereupon the character is then indicated in standard lettering in a suitable display.

The panel is advantageously made for input of the characters tracing with a finger. By this means, even persons of little skill are enabled to effect input of characters without further auxiliary means such as a stylus or the like.

DESCRIPTION OF PREFERRED EMBODIMENTS

Figure 1:
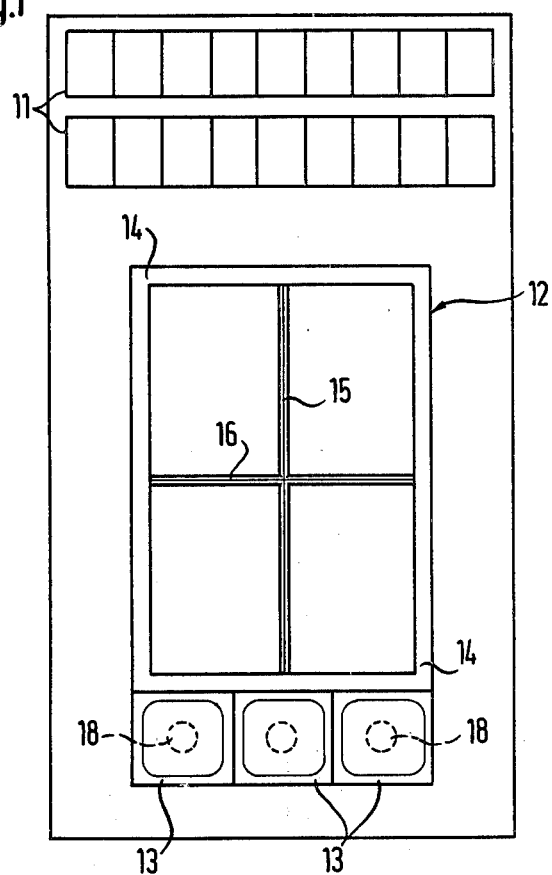
FIG. 1 is a plan view of a write-in device in accordance with the present invention.
Figure 2:
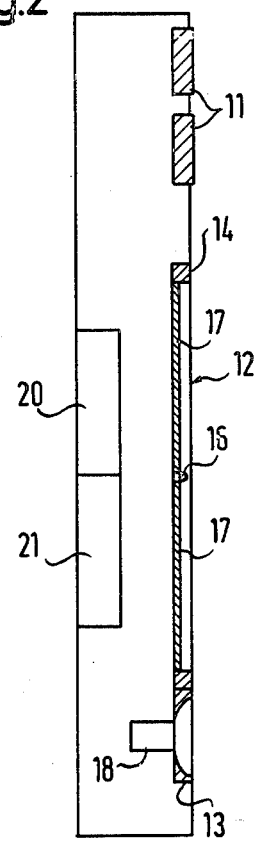
FIG. 2 is a longitudinal section (from the left) through the device of FIG. 1.

The write-in device or input apparatus illustrated in FIGS. 1 and 2 is a portable device adapted for input of alpha-numeric characters by movements of the user's finger. The device has an upper region with two rows of indicator units 11 and beneath them, a panel 12 which functions as an input zone. A single panel 12 is shown but a plurality of such panels may be provided in side-by-side relationship instead. Directly underneath the panel 12 at the lower end of the device three additional function keys 13 are provided. The panel 12 has a raised periphery 14 and a graticule of raised crossed centrelines 15 and 16.

At appropriate positions on the panel 12, sensors 17 (FIG. 2) are provided, as described in greater detail below. On being touched with the finger or with a stylus the sensors modify or emit an electrical signal. Other sensors 18 are provided beneath the function keys 13, which in the example shown have a circular cross-section as seen in FIG. 1 from above. The sensors 17, 18 and the indicator units 11 are electrically connected to a logic and memory unit 21.

Write-in or input of characters into the input zone of the illustrated device is performed as follows. Instead of firstly looking on a keyboard for a character which is to be entered, for example a figure or a letter, especially a capital letter, or a special character, and then typing it, the user of the device sketches the character on the panel 12. Depending upon the execution and size of the panel 12, a special stylus, a metal pencil, or the user's finger is used to describe the character.

On completion of this input process, the character entered is reproduced to the user for checking in standard lettering or numbering on the indicator units 11 or on one of them. If necessary, the character may be corrected by erasure followed by fresh input. Erasure of a character may be effected by actuation of one of the function keys 13. Visual indication by means of the indicator units 11 may be supplemented or replaced by an acoustic indication. The visual indications may be effected by a display located underneath the panel 12.

A series of characters may be entered either on a plurality of panels arranged for example side by side or by making repeated use of a single panel 12, in which event the characters are advantageously displayed by the indicator units 11 in the sequence in which they have been entered.

In the input device illustrated, a unit 20 is provided for radio transmission of signals corresponding with the characters entered, and for reception of replies. By actuation of one of the function keys 13 after conclusion of input, if bytemode transmission is not desired, a blockwise data transmission may be triggered, and a reply received.

The end of the input step for one character is indicated where a plurality of panels is provided by changing to the next panel, and in the case of multiple use of only one panel 12, by a short pause or by actuating one of the function keys 13. At the end of the input process, the appropriate character is associated with the combination and sequence of the sensors 17 which have responded, and is reproduced on one of the indicator elements 11. Combinations of sensor actuation with which no reproducible character corresponds cause a flashing signal to be produced.

The sensors 17 of the panel 12 as well as the sensors 18 of the function keys 13 and the indicator elements 11 are connected via a data collection and a control collection line to the electronic logic and memory unit 21.

The unit 21 consists for example of a microprocessor, suitably an Intel 8080, with a program register, a data register, a module for data transmission and two input/output units. The electronic processing of the data as well as the interface for data transmission are effected in accordance with known techniques.

With the panel 12 described, a restricted number of sensors 17 can be activated in certain sequences for enabling the whole of the alphanumeric set of characters, as well as special characters to be passed on to the logic and memory unit 21 by sketching or writing each character by means of a finger, stylus, pencil or the like on the panel without any geometrical guide means. Acknowledgment signals and reply signals are processed by the logic and memory unit 21 and displayed by means of the indicator elements 11.

Figure 3:
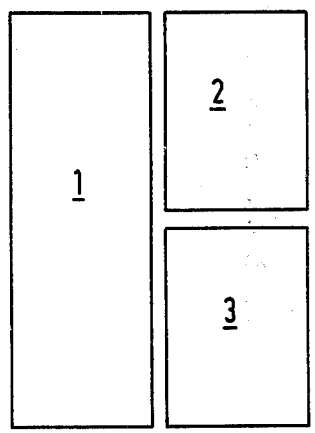
FIG. 3 diagrammatically shows a modification of parts of the device of FIG. 1.

FIG. 3 shows an arrangement of three touch-sensitive areas of sensors 1, 2, 3 which represents the minimum number of sensors if the natural way of writing characters is to be preserved during the input step. Whilst each of the sensors 1, 2 or 3 is touched or traversed a signal is produced, but signals due to simultaneous touching of two of the sensors are ignored by the associated microprocessor or other electronic equipment. Simultaneous touching of all three sensors 1, 2 and 3 in the center of the panel produces outputs which are recognized as a fourth signal. Four signals are thus accepted by the microprocessor, and these are designed in what follows by the figures 1, 2, 3 and 4 corresponding respectively with the actuation of sensors 1, 2 and 3 and the actuation of all of the sensors together. A panel of this kind may be written upon with a stylus or with the finger, depending upon its size.

In accordance with the normal way of writing, two quite different signal sequences result from the letter B and the figure 8 as follows:

B: 1, 12431
8: 2143142; 1431421.

A comma in the sequence of the signals indicates the raising of the stylus or finger during writing; after the semicolon a sequence for another way of writing is shown.

With a panel of the kind indicated in FIG. 3 having three sensors all of the capital letters of the alphabet with the exception of the letter W, every figure, as well as some special characters, may be encoded by writing in the way usual for all these characters. For the letter W only, in order to distinguish it from the letter N, a slight modification must be specified, namely that the letter is written by two intersecting letters V, thus W.

It has proved at least in the sphere of the German language that the way of writing a written character, with the exception of some fixed variants in the case of certain characters, for example, in the case of the letter K, is always the same. Three sensors represent the minimum if a natural way of writing is to be preserved as the input; a panel having two sensors would by contrast make necessary too many instructions about writing specifying deviations from the normal and usual way of writing.

Figure 4:
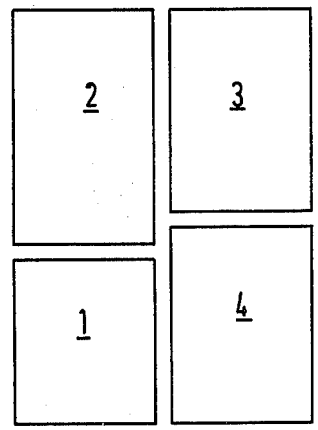
FIG. 4 diagrammatically shows a second modification of parts of the device of FIG. 1.

FIG. 4 shows a panel 12 having four sensors 1, 2, 3 and 4, which with only one additional sensor provides considerably more redundancy and thus can take into consideration practically every different way of writing one and the same character. Touching each of the sensors 1 through 4 gives at the time of touching signals 1 through 4, whilst touching all four sensors produces a signal 5.

Table 1 below shows the signal sequence for each of the capital letters of the alphabet and the numbers 0 through 9. To deal with the problem which exists in distinguishing between certain characters, differences must be made in the way of writing the figure 0 and the letter O. In the present instance, 0 is employed for the letter O and $\phi$ or o for the figure zero. In Table 1 a comma in the signal sequence again means the finger or stylus is raised from the surface in writing, whilst after a semicolon a signal sequence is given for an alternative way of writing. Signals put in brackets indicate an optional addition, for example, a cross-stroke in the case of the figure 7.

Table 1

| Signal sequence for a panel having four sensors | | | |
|---|---|---|---|
| A | 1234, 25 | T | 23, 5 |
| B | 21,23541 | U | 2143 |
| C | 3214 | V | 2153, 2543 |
| D | 21, 2341; 21, 251 | W | 21543 |
| E | 21, 23, 25, 14 | X | 24, 31 |
| F | 21, 23, 25 | Y | 25, 351 |
| G | 32145 (2) | Z | 23514, 25 |
| H | 21, 25, 34 | | |
| I | 21 | $\phi$ | 32143, 51 |
| J | 341; 2341 | 0 | 5145 |
| K | 2153, 54; 21,354 | 1 | 534 |
| L | 214 | 2 | 23514 |
| M | 12534 | 3 | 23541 |
| N | 12543 | 4 | 25, 34 |
| O | 32143 (53) | 5 | 2541, 23 |
| P | 21, 2352 | 6 | 35145; 2145 (2) |
| Q | 32143, 54 | 7 | 2351 (25) |
| R | 21, 2354 | 8 | 3254153 |
| S | 32541 | 9 | 32534 (1) |

In Table 2 is shown an analysis of the individual characters according to the signal sequence. Table 2 shows clearly the freedom from ambiguity of the recognition of characters with four sensors as described.

Table 2

| Analysis according to the signal sequence | | | |
|---|---|---|---|
| 1234, 25 | A | 2351, (25) | 7 |
| 12534 | M | 23514 (25) | Z |
| 12543 | N | | |
| | | 24, 31 | X |
| 21 | I | | |
| 21, 23, 25 | F | 25, 34 | 4 |
| 21, 23, 25, 14 | E | 2541, 23 | 5 |
| 21 23 41 | D | 25, 351 | Y |
| 21 23 541 | B | 2543 | V |
| 21 23 52 | P | | |
| 21 23 54 | R | 3214 | C |
| | | 32145(2) | G |

Table 2-continued

| Analysis according to the signal sequence | | | |
|---|---|---|---|
| 21 25 34 | H | 32143, 51 | $\phi$ |
| 21 25 23 | F | 32143 (53) | O |
| | | 32143, (54) | Q |
| 21, 354 | K | 3254153 | 8 |
| 214 | L | 32534 (1) | 9 |
| 21452 | G | | |
| 2143 | U | 32541 | S |
| 21543 | W | | |
| 2153, 54 | K | 341 | J |
| 2153 | V | | |
| 2341 | J | 35145 | 6 |
| 235 | T | | |
| 23541 | 3 | 5145 | O |
| 23514 | 2 | 534 | 1 |

If the associated electronic equipment consists of a microprocessor system, then arranging for recognition of the signals, exclusion of extraneous signals or noise such as contact chatter, conversion of the signal sequence into the corresponding character, and provision and outputs representing the character for display on a display zone for checking by the user, all represent routine measures needing no further description.

The microprocessor system may also be adapted to effect such further processing as the storage of characters, transmission to a data processing system and the reception of replies. These functions may be controlled externally by simple function keys as described above. Amongst them is the erasure of a character which has been entered and then recognized as incorrect.

Input of a character sequence may be effected either by multiple use of a single panel 12, in which case each writing process for one character must be terminated by a pause or by the actuation of a function key by the user. The sequence of characters may instead be entered one character after the other on a plurality of panels lying side by side, all of which are connected to the microprocessor system.

Figure 5:
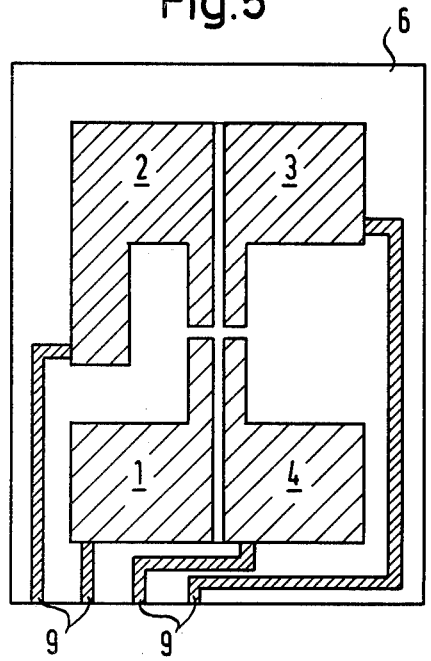
FIGS. 5 through 7 are plan views respectively of base, middle and top laminates incorporates in the device of FIG. 1.
Figure 6:
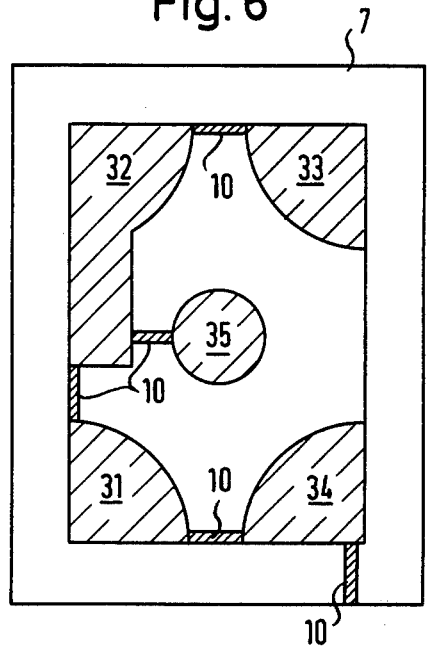
Figure 7:
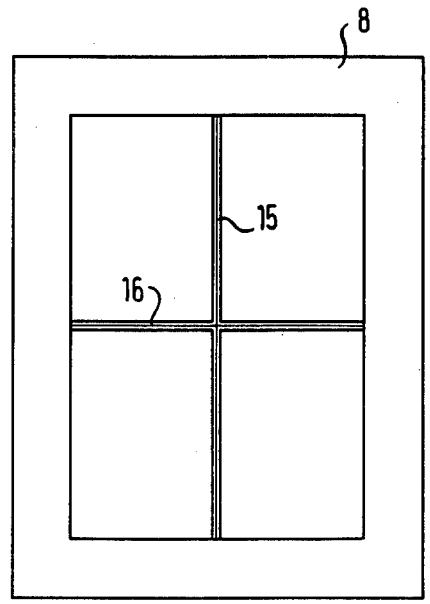

In FIGS. 5 through 7 three elements are shown which are joined together into a panel 12 on a rigid support. If a finger is used for effecting the data input, the panel 12 should be about 5×7 cm in size and should have a raised periphery as a boundary.

The panel 12 comprises three generally planar elements 6, 7 and 8. The lowermost element, shown in FIG. 5, is mounted on a rigid base and is provided with printed conductive areas constituting the sensors 1, 2, 3 and 4. Conductive tracks 9 lead from the four sensors into the associated electronic processing system.

FIG. 6 shows an element 7 which is located above the element 6 with an insulating layer interposed. The insulating layer provides for contact between the elements 6 and 7 only under pressure.

The element 7 comprises a printed circuit with conductive areas 31, 32, 33 and 34 which are adapted to lie above the sensors 1, 2, 3 and 4. Moreover a circular area 35 is included in the printed circuit which allows contact to be made with all four sensors 1 to 4. This area 35 is formed as an upward bulge which under pressure buckles downwardly to effect contact with all four sensors 1, 2, 3 and 4 of the element 6 when a touch occurs in this region. The areas 31 through 35 are connected together and to the associated circuitry by means of conductive tracks 10.

The sensor 2 is made unsymmetrical with respect to the other sensors in such a way that the direction of a central stroke can be established. This difference is essential for the distinction between the letters P and F.

Touching the areas 31 through 35 of the element 7 causes the voltage supplied to these areas to be applied, to the respective sensors 1, 2, 3 and 4 located underneath them.

Touching the area 35 passes on the voltage simultaneously to all four sensors 1, 2, 3 and 4. Thus five signals are carried by four data leads. The signal sequence for the characters is shown in Tables 1 and 2.

For protection of the element 7, a further element 8 shown in FIG. 7 is provided to overlie it. This protective element has two crossed raised centrelines 15 and 16 as a graticule for better orientation of the characters to be drawn.

If the elements 6, 7 and 8 are all of transparent material the area under the foils can be used as display area.

It will be evident that instead of the pressure-sensitive sensors described, sensors of other kinds may be employed. Thus, it is sufficient, for example, to detect over-stepping of the area boundaries instead of pressure on the areas 31 through 35 or the sensors 1, 2, 3 and 4 respectively. Sensors constructed similarly to the pressure-sensitive sensors described are commercially available and are used, for example, for keyboards.

Where reference is made herein to the provision of an electrical signal, it is to be understood that the expansion can comprehend modification or cessation of an electric current as well as the causing of such a current to flow.

It is evident that those skilled in the art may make numerous modifications of the specific embodiments described above without departing from the present inventive concepts. It is accordingly intended that the invention shall be construed as embracing each and every novel feature and novel combination of features present in or possessed by the apparatus herein described and that the foregoing disclosure shall be read as illustrative and not as limiting except to the extent set forth in the claims appended hereto.

I claim:

1. A method of producing an output representing a written character, the method comprising the steps of writing each character on an input area with a writing means, generating electric signals in response to the traverse by the writing means of three or more sub-areas of the input and the simultaneous traverse of at least two of said sub-areas, storing the generated signals in the time sequence in which they were generated, comparing said stored signal sequence with predetermined character representing signal sequences, and providing said output in response to correspondence between said stored signal sequence and one of said predetermined sequences.

2. A character input device for providing electrical signals representative of a character, the device comprising:
   means defining a character reception area on which a character can be written,
   means subdividing said area into sub-areas, and electrical sensor means operatively associated with said reception area and adapted to provide an electrical signal in response to the presence of a character trace on each of said sub-areas,
   an additional sensor means being disposed underneath the sub-areas and adapted to provide an electric signal in response to the writing simultaneously on at least two of the sub-areas of a part of a character, and
   character recognition means responsive to the time sequence of said signals, inclusive of repetition of any one of said signals, to recognize a character written on said area according to the characteristic time sequence when writing such a character.

3. The device of claim 2 wherein said character recognition means comprises means for storing said signals in time sequence, and means for testing said signals according to a predetermined program to establish coincidence between said stored signals sequence and predetermined signal sequences in said program.

4. A device of claim 3 further comprising display means for indicating characters in standard form, and means in said character recognition means for causing said display means to indicate a character on recognition by the recognition means of the character in written form.

5. The device of claim 2 having four of said sensor means associated with respective sub-areas and wherein at least two of the sub-areas have unlike shapes.

6. The device of claim 2 having four of said sensor means, and wherein said additional sensor means is adapted to provide said signal in response to the writing simultaneously on all four sub-areas of a part of a character.

7. The device of claim 2 wherein said sensor means and said additional sensor means comprise a rigid support means, an inter sheet means, means mounting said support means and said outer sheet means with respective faces thereof adjacent but normally spaced apart, and first and second electrically conductive means on selected portions of the adjacent faces of the support means and the inter sheet means respectively, the outer sheet means being flexible whereby the writing of a character on the face thereof remote from the support means effects electrical contact between the first and second conductive means.

8. The device of claim 7 wherein said input area defining means comprises a protective layer provided over said outer sheet means.

9. The device of claim 8 wherein said protective layer has two crossed centrelines slightly elevated above the general level thereof.

10. The device of claim 7 wherein said additional sensor means comprises a portion of said outer sheet means adapted to resiliently deform towards said support means.

11. The device of claim 7 wherein said support means and said sheet means are transparent, and said device further comprising display means adapted to indicate a character in response to the recognition thereof by said character recognition means.

12. The device of claim 2 further comprising means adjacent said input area adapted to display a character in response to recognition thereof by said character recognition means.

13. The device of claim 2 constructed as a portable device and further comprising radio transmission means for communication with apparatus adapted to operate on signals representative of characters written into said input device.

14. The device of claim 2 wherein a plurality of said character input areas is provided.

15. The device of claim 2 wherein said sensor means is responsive to the tracing of a character by a user's finger.

* * * * *